(12) United States Patent
Russ et al.

(10) Patent No.: US 7,838,939 B2
(45) Date of Patent: Nov. 23, 2010

(54) ESD PROTECTION ELEMENT

(75) Inventors: Christian Russ, Diedorf (DE); Harald Gossner, Riemerling (DE); Michael Fulde, Weil (DE)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 11/750,660

(22) Filed: May 18, 2007

(65) Prior Publication Data

US 2007/0267700 A1 Nov. 22, 2007

(30) Foreign Application Priority Data

May 18, 2006 (DE) .................. 10 2006 023 429

(51) Int. Cl.
*H01L 23/62* (2006.01)
(52) U.S. Cl. .................................. 257/355
(58) Field of Classification Search .......... 257/355, 257/237, 514, 656, 110, 279, 458, 461–464, 257/470, 490, 494–495, 509, 525, 544–550, 257/625, 927, 929, 199, 212, 603, 551, 347, 257/349, 173, 288, 328, 594, 601, E29.195, 257/E31.036, E31.087–E31.088, E31.061–E31.062
See application file for complete search history.

(56) References Cited

U.S. PATENT DOCUMENTS 3,728,591 A    4/1973   Sunshine
5,610,790 A *  3/1997   Staab et al. ............ 361/56
6,034,397 A    3/2000   Voldman
6,496,341 B1   12/2002  Chen et al.
6,617,649 B2   9/2003   Chang et al.
6,645,820 B1   11/2003  Peng et al.
6,671,146 B1 * 12/2003  Hashimoto et al. ....... 361/56
6,677,642 B2 * 1/2004   Peake et al. ............ 257/335
6,690,065 B2   2/2004   Chang et al.
6,936,895 B2 * 8/2005   Manna et al. ........... 257/355
6,969,891 B1   11/2005  Leroux et al.
7,173,310 B2 * 2/2007   Voldman et al. ......... 257/350
2004/0188705 A1* 9/2004  Yeo et al. .............. 257/170
2005/0077577 A1* 4/2005  Manna et al. ........... 257/355
2006/0017139 A1* 1/2006  Eguchi et al. .......... 257/656

FOREIGN PATENT DOCUMENTS

DE      2 226 613          3/1973
WO      WO-2004/051749 A1  6/2004

OTHER PUBLICATIONS

D. A. Buchannan et al., "Fabrication of midgap metal gates compatible with ultrathin dielectrics," IBM-Research, Thomas J. Watson Research Center, Route 134, Yorktown Heights, New York 10598. Received Oct. 14, 1997; accepted for publication Jul. 22, 1998.*

* cited by examiner

*Primary Examiner*—Dao H Nguyen
*Assistant Examiner*—Tram H Nguyen
(74) *Attorney, Agent, or Firm*—Dickstein Shapiro LLP

(57) ABSTRACT

According to one embodiment of the present invention, an ESD protection element for use in an electrical circuit is provided, including a plurality of diodes which are connected in series with one another and which are formed in a contiguous active area, wherein the ESD protection element has a fin structure.

43 Claims, 6 Drawing Sheets

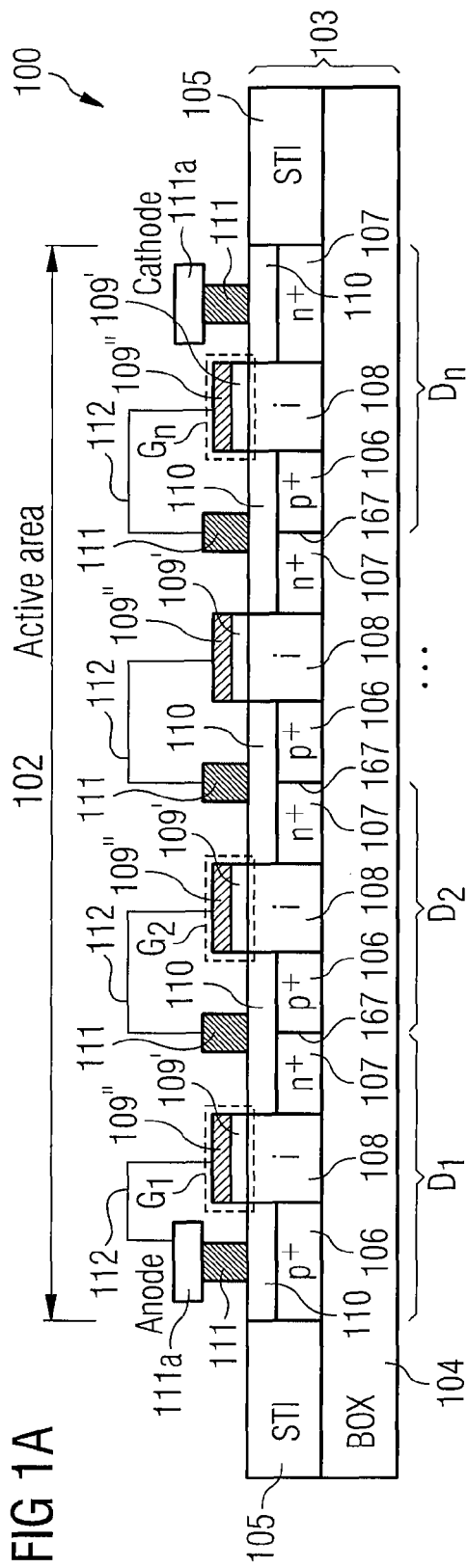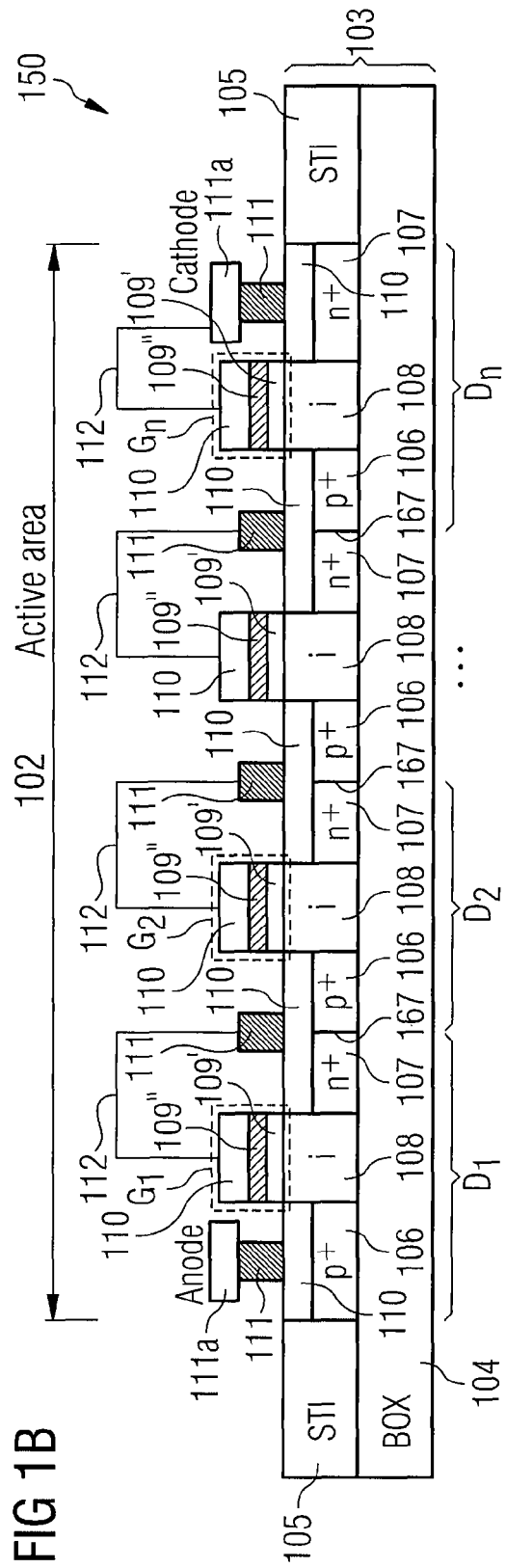

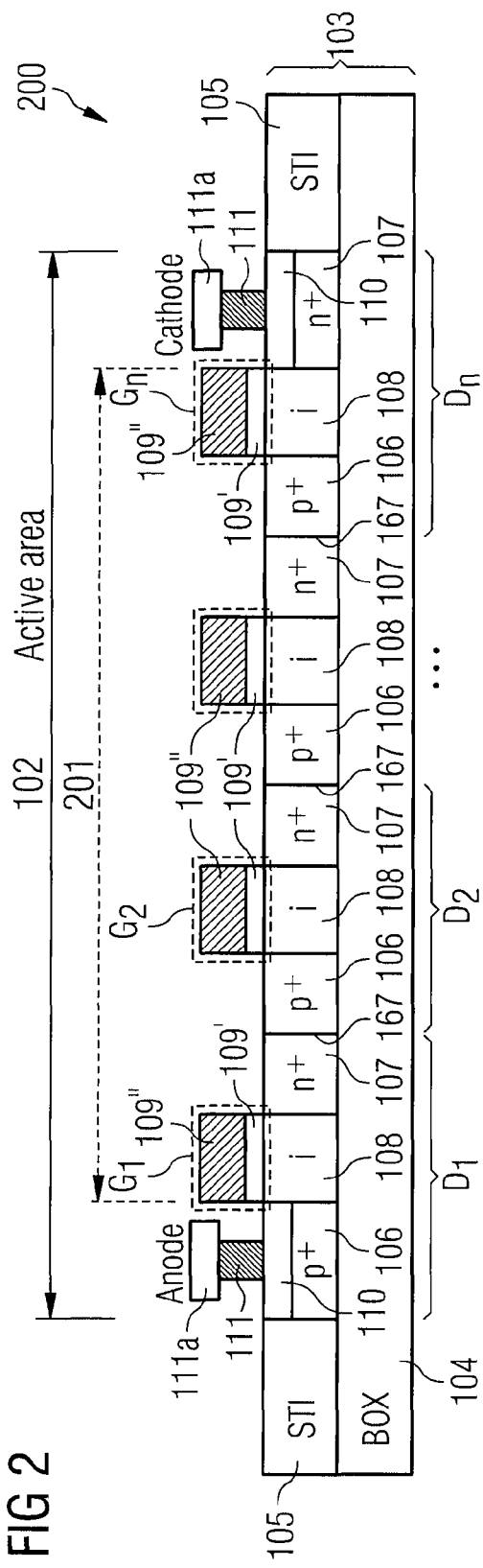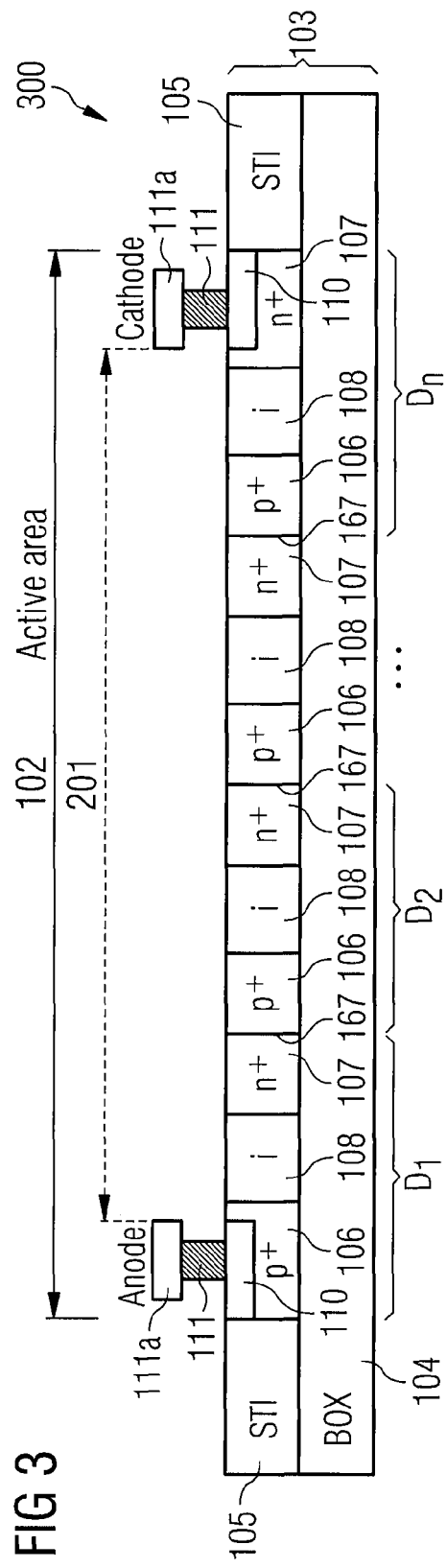

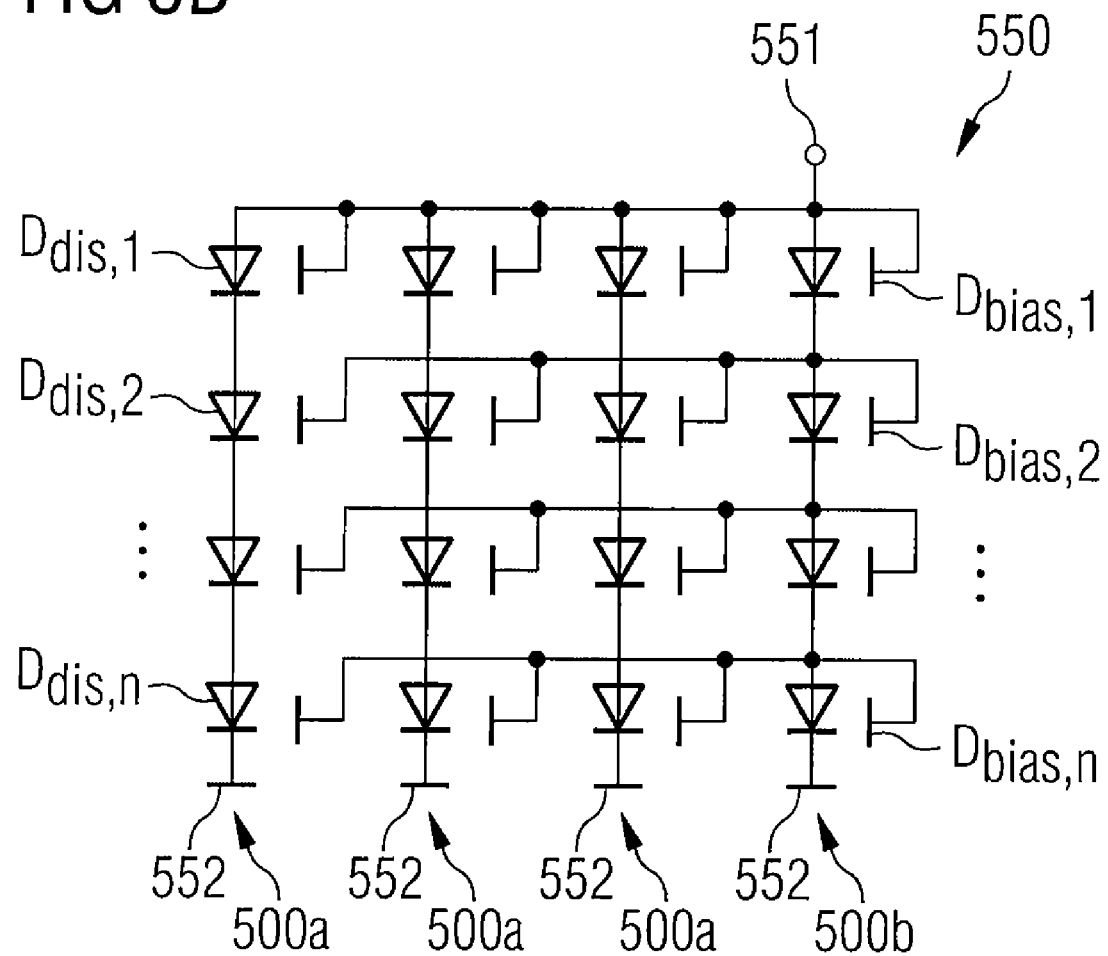

ESD PROTECTION ELEMENT

CROSS-REFERENCE TO RELATED APPLICATION

This application claims priority to German Patent Application Serial No. 10 2006 023 429.4, which was filed May 18, 2006, and is incorporated herein by reference in its entirety.

BACKGROUND

The invention relates to an ESD protection element and an ESD protection device for use in an electrical circuit, and a method for manufacturing an ESD protection element.

It is desirable to provide ESD protection elements for Fin-FET or MuGFET technologies.

BRIEF DESCRIPTION OF THE DRAWINGS

In the drawings, identical reference symbols generally designate the same constitute parts throughout the various views. The drawings are not necessarily true to scale. Instead, the main emphasis is generally placed on illustrating the principles of the invention. Various exemplary embodiments of the invention are described in the description below with reference to the following drawings, in which:

FIG. 1A shows an ESD protection element in accordance with one exemplary embodiment of the invention;

FIG. 1B shows an ESD protection element in accordance with another exemplary embodiment of the invention;

FIG. 2 shows an ESD protection element in accordance with another exemplary embodiment of the invention;

FIG. 3 shows an ESD protection element in accordance with another exemplary embodiment of the invention;

FIG. 5B shows a schematic circuit diagram for the ESD protection device illustrated in FIG. 5A.

DESCRIPTION

Figure 4:
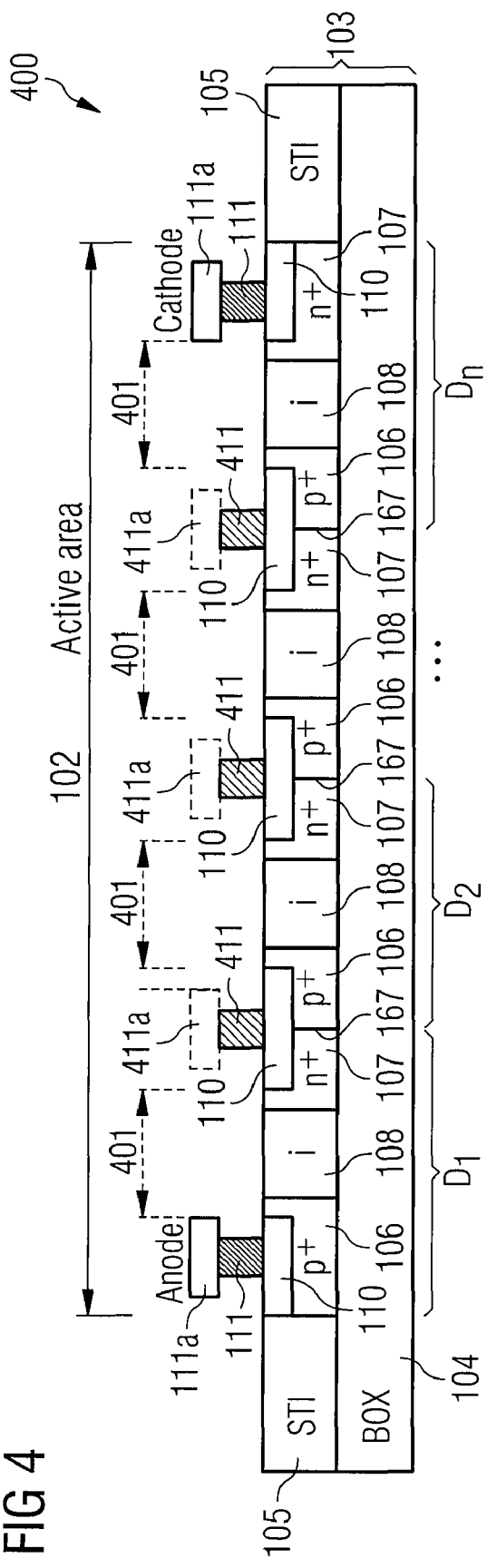
FIG. 4 shows an ESD protection element in accordance with another exemplary embodiment of the invention.

On account of the limited scalability in bulk CMOS technologies (CMOS: Complementary Metal Oxide Semiconductor) it is expected that FinFET devices (FinFET: Fin Field Effect Transistor=field effect transistor having a fin structure) or MuGFET devices (MuGFET: Multi-Gate Field Effect Transistor=field effect transistor having a fin structure in which a channel region is driven with the aid of a plurality of gates from at least two sides) will be used in the future. FinFET devices are typically designed for high-speed logic core applications with low supply voltages (for example 0.8 V to 1.2 V).

Multi-Gate devices or FinFET devices such as are manufactured in highly advanced technologies are extremely susceptible to damage due to electrostatic discharges (ESD). The ESD sensitivity of said devices even surpasses the known high ESD sensitivity of conventional silicon on insulator (SOI) technologies. The principal reasons for this are, on the one hand, the extremely small geometrical structures of the narrow silicon fins, and, on the other hand, the high thermal insulation of the fins, which results as a disadvantageous side effect of the desirable electrical insulation of the transistor structures formed by means of a thin conductive silicon layer on a nonconductive buried oxide layer (buried oxide, BOX).

Output drivers and any other constituent parts (including components connected to voltage supply lines) in such highly developed technologies have to be protected against ESD events. For this reason, ESD protection devices are required which reliably dissipate the energy of an ESD pulse to ground, without themselves being damaged in the process. An ESD protection device should have, inter alia, a low ESD turn-on voltage.

In the case of a conventional diode stack composed of lateral polycrystalline silicon diodes (polysilicon diodes) connected in series with one another, which serves for the ESD protection of voltage supply connections, a silicide blocking is necessary in order to prevent one or a plurality of diodes from being short-circuited at the surface. The diode stack can be realized in SOI technologies, in principle, but no longer in emerging process flows in which metals are used as gate material and polysilicon is therefore not available.

In other conventional polysilicon diodes and diode stacks which are based on bulk technologies or SOI technologies and which serve for use as an ESD protection device in low-noise applications, the diodes have a well in bulk technologies, and a base region for SOI technologies. The well region or base region permits only a capacitive coupling to a diode, whereas a direct electrical connection does not exist. Another conventional device for an SOI technology has substrate contacts.

Another conventional dual-gate-coupled diode for ESD applications has an SOI structure. The diode can only be used in those technologies which afford the possibility for electrical contact-connection of the body and/or have a second gate arranged in the buried oxide of the SOI structure.

The abovementioned conventional ESD protection devices have the disadvantage that they cannot be used in present-day MuGFET technologies or FDSOI technologies (FDSOI: Fully Depleted SOI=SOI structure fully depleted of charge carriers). The conventional devices mentioned require either body contacts and/or polysilicon gates, and/or a second gate in the BOX region.

In accordance with one exemplary embodiment of the invention, an ESD protection element for use in an electrical circuit is provided, having a plurality of diodes which are connected in series with one another, wherein the diodes are formed in a contiguous active area.

In accordance with another exemplary embodiment of the invention, an ESD protection device for use in an electrical circuit is provided. The ESD protection device has at least one ESD protection element, which is connected in parallel with at least one element of the electrical circuit that is to be protected against an ESD event.

In accordance with another exemplary embodiment of the invention, a method for producing an ESD protection element is provided. In the case of the method, a plurality of diodes which are connected in series with one another are formed in a contiguous active area.

In accordance with another exemplary embodiment of the invention, an ESD protection based on diodes or diode stacks is provided in a MuGFET technology or an SOI technology.

In accordance with another exemplary embodiment of the invention, an ESD protection element is provided which has a plurality of diodes which are connected in series with one another, wherein the diodes are formed in an individual contiguous active area. In other words, the diodes of the ESD protection element are formed in a common active area and not, as for example in conventional diode stacks, in a plurality of separate active areas. The formation of the diodes in a contiguous active area enables a compact layout implementation. Furthermore, there is no need for any metal connections between the individual diodes of the ESD protection element.

In accordance with another exemplary embodiment of the invention, the active area has silicon. The active area may be formed in a silicon layer in accordance with another exemplary embodiment of the invention.

In accordance with another exemplary embodiment of the invention, the active area is formed on an electrically insulating layer, for example on an oxide layer buried in a substrate (Buried Oxide, BOX), for example on a silicon dioxide layer.

In accordance with another exemplary embodiment of the invention, the ESD protection element has a silicon on insulator (SOI) structure.

In accordance with another exemplary embodiment of the invention, the ESD protection element has a fin structure. In accordance with this exemplary embodiment, the active area is formed in the fin. The fin structure or fin may be formed on an electrically insulating layer, e.g. on a buried oxide layer (buried oxide, BOX) formed in a substrate.

In accordance with another exemplary embodiment of the invention, the ESD protection element has a plurality of first doped regions, wherein the plurality of first doped regions have a first conductivity type. In accordance with this exemplary embodiment, the ESD protection element furthermore has a plurality of second doped regions, wherein the plurality of second doped regions have a second conductivity type, which is opposite to the first conductivity type. Furthermore, in accordance with this exemplary embodiment, each diode has in each case a first doped region and a second doped region adjacent to the first doped region.

In accordance with another exemplary embodiment of the invention, the plurality of first doped regions is p-doped (for example $p^+$-doped), and the plurality of second doped regions is n-doped (for example $n^+$-doped) in accordance with this exemplary embodiment.

In accordance with another exemplary embodiment of the invention, at least one diode has at least one intrinsic region which is formed between the first doped region and the second doped region of the at least one diode. As an alternative, at least one weakly doped region may be formed between the first doped region and the second doped region of the at least one diode. The at least one weakly doped region may be formed as a weakly p-doped region, alternatively as a weakly n-doped region. The at least one weakly doped region may have a dopant concentration of approximately less than or equal to $10^{18}$ cm$^{-3}$.

The following exemplary embodiments of the invention, relating to an ESD protection element having at least one intrinsic region or at least one weakly doped region, are described only in connection with the at least one intrinsic region, for the sake of clarity. However, the exemplary embodiments mentioned also hold true in an analogous manner for an ESD protection element having at least one weakly doped region.

In accordance with another exemplary embodiment of the invention, the ESD protection element has at least one gate region which is formed on or above the at least one intrinsic region.

Illustratively, a diode having an intrinsic region on or above which a gate region is formed can be referred to as a gated diode. Conversely, a diode having an intrinsic region on or above which no gate region is formed can be referred to as a non-gated diode.

In accordance with another exemplary embodiment of the invention, the at least one gate region has an electrically insulating layer or a gate dielectric (e.g. a gate oxide) and also an electrically conductive gate layer formed on the electrically insulating layer.

In accordance with another exemplary embodiment of the invention, the ESD protection element has n (n∈N, n≧2) diodes which are connected in series with one another, wherein for all k (k∈N, 1≦k≦n−1) it holds true that the second doped region of the k-th diode and the first doped region of the (k+1)-th diode have a common interface. Clearly, if the second doped region of the k-th diode is n-doped and the first doped region of the (k+1)-th diode is p-doped (or vice versa), in accordance with this exemplary embodiment a pn junction is formed between the k-th diode and the (k+1)-th diode.

In accordance with another exemplary embodiment of the invention, the ESD protection element has n intrinsic regions (in other words regions having intrinsic conductivity), wherein the k-th (k∈N, 1≦k≦n) intrinsic region is formed between the first doped region and the second doped region of the k-th diode.

In accordance with another exemplary embodiment of the invention, the ESD protection element has n gate regions, wherein for all k (k∈N, 1≦k≦n) it holds true that the k-th gate region is formed on or above the k-th intrinsic region.

In accordance with another exemplary embodiment of the invention, for all k (k∈N, 1≦k≦n) it holds true that the k-th gate region is electrically coupled to the first doped region of the k-th diode and/or to the second doped region of the (k−1)-th diode.

In accordance with another exemplary embodiment of the invention, for all k (k∈N, 1≦k≦n) it holds true that the k-th gate region is electrically coupled to the second doped region of the k-th diode and/or to the first doped region of the (k+1)-th diode.

In accordance with another exemplary embodiment of the invention, at least one of the plurality of first doped regions and/or at least one of the plurality of second doped regions is silicided.

In accordance with another exemplary embodiment of the invention, for all k (k∈N, 1≦k≦n−1) it holds true that the second doped region of the k-th diode and the first doped region of the (k+1)-th diode have a common silicide layer.

Clearly, in accordance with one exemplary embodiment of the invention, the k-th diode and the (k+1)-th diode adjacent to the k-th diode can be electrically connected to one another with the aid of a silicide layer formed on the second doped region of the k-th diode and the first doped region of the (k+1)-th diode. In other words, by way of example, a pn junction formed between the k-th diode and the (k+1)-th diode (generally between two adjacent diodes) of the ESD protection element can be bridged with the aid of the silicide or the silicide layer.

In accordance with another exemplary embodiment of the invention, for at least one k (k∈N, 1≦k≦n−1) it holds true that at least one dummy contact structure is formed on or above the second doped region of the k-th diode and/or on or above the first doped region of the (k+1)-th diode.

Clearly, in accordance with one exemplary embodiment of the invention, for example one or a plurality of series of dummy contact structures or dummy contacts may be formed on a silicided pn junction (e.g. N+/P+ junction) formed between the k-th diode and the (k+1)-th diode.

A dummy contact can be understood to be a contact which has a similar structure to an electrical contact but, in contrast to the electrical contact, is not used for electrical contact-connection.

In accordance with another exemplary embodiment of the invention, the at least one dummy contact structure or the at least one dummy contact may have a metal material (for example tungsten or aluminum), or be formed as a metal contact.

In accordance with another exemplary embodiment of the invention, at least one layer having a high thermal conductivity and/or a high specific heat capacity is formed on the at least one dummy contact structure. The at least one layer may have a metal material (e.g. copper, aluminum, tungsten) or may be formed as a metal layer. As an alternative, the at least one layer may have a metal alloy (e.g. an aluminum-silicon-copper alloy).

Clearly, in accordance with one exemplary embodiment of the invention, dummy metal strips may be formed on the dummy contacts.

With the aid of the dummy contacts or the dummy metal strips formed on the dummy contacts, in accordance with one exemplary embodiment of the invention it is possible to achieve an improved cooling of the ESD protection element during an ESD discharge event, since, by way of example, the heat generated by a high ESD current can be dissipated better by means of the dummy contacts.

In accordance with another exemplary embodiment of the invention, in the case of an ESD protection element having n (n∈N, n≧2) diodes connected in series, the first doped region of the first diode is electrically coupled to a high electrical potential, and/or the second doped region of the n-th diode is electrically coupled to a low electrical potential.

In accordance with another exemplary embodiment, the first doped region of the first diode may be electrically coupled for example to an electrical supply voltage or to a voltage-carrying node of the electrical circuit.

In accordance with another exemplary embodiment of the invention, at least one of the first doped regions and/or at least one of the second doped regions has a dopant concentration of approximately greater than $10^{20}$ cm$^{-3}$.

In accordance with another exemplary embodiment of the invention, it is provided that the electrically conductive gate layer has one or a plurality of metal materials. The electrically conductive gate layer may be formed as a metal layer. As an alternative, the electrically conductive gate layer may have a metal alloy or comprise a metal alloy.

In accordance with another exemplary embodiment of the invention, it is provided that the electrically conductive gate layer has a midgap material or comprises a midgap material.

A midgap material may be understood to be a material in which the value of the work function of electrons $W_{a,e}$ is approximately equal to the negative value of the work function of holes $W_{a,h}$. In other words, $W_{a,e} \approx -W_{a,h}$ holds true for a midgap material. Furthermore, when using one and the same midgap material as gate material of an NMOS field effect transistor and as gate material or a PMOS field effect transistor, it holds true that the value of the threshold voltage of the NMOS transistor $V_{th,NMOS}$ is approximately equal to the negative value of the threshold voltage of the PMOS transistor $V_{th,PMOS}$, i.e. $V_{th,NMOS} \approx -V_{th,PMOS}$.

In accordance with one exemplary embodiment of the invention, the electrically conductive gate layer may consist of or comprise for example one or a plurality of the following materials: Al, Hf, Ir, Mo, Ni, Pd, Pr, Pt, Re, Rh, Ru, Ti, W, Y, Zr, a titanium boride, HfN, HfSiN, LaN, LaSiN, MoN, RuN, RuSiN, TaN, TaCN, TaSiN, TiN, TiAlN, TiCN, TiSiN, VN, WN, WSiN, ZrN, ZrSiN, a titanium phosphide, a titanium antimonide, CoSi$_x$, NiSi$_x$, TiSi$_x$, WSi, RuTa, PtTi, TiW, a partially silicided material, FuSi, other metals. In this context, "FuSi" denotes fully silicided. In other words, in this case the gate material is illustratively formed as a continuous silicide or a fully silicided material.

In accordance with one exemplary embodiment of the invention, the electrically conductive gate layer may have one or a plurality of partial layers, wherein at least one of the partial layers may have one or a plurality of the abovementioned gate materials.

In accordance with another exemplary embodiment of the invention, in an ESD protection element having one or a plurality of gate regions, metals are used as gate material (i.e. as material for the electrically conductive gate layer), with the result that, by way of example, processes in which polycrystalline silicon (polysilicon) is not available can also be used for the production of the ESD protection element.

In alternative exemplary embodiments of the invention, polysilicon may be used as material for the electrically conductive gate layer.

In accordance with another exemplary embodiment of the invention, it is provided that the ESD protection element is set up as a diode stack (alternatively also referred to as a diode chain or diode string).

In accordance with another exemplary embodiment of the invention, an ESD protection device has at least one first ESD protection element having n (n∈N) gated diodes, and also at least one second ESD protection element likewise having n gated diodes, wherein for all k (k∈N, 1≦k≦n) it holds true that the k-th gate region of the at least one first ESD protection element is electrically coupled to the first doped region of the k-th diode of the at least one second ESD protection element and/or to the second doped region of the (k−1)-th diode of the at least one second ESD protection element.

In accordance with another exemplary embodiment of the invention, an ESD protection device has at least one first ESD protection element having n (n∈N) gated diodes, and also at least one second ESD protection element likewise having n gated diodes, wherein for all k (k∈N, 1≦k≦n) it holds true that the k-th gate region of the at least one first ESD protection element is electrically coupled to the second doped region of the k-th diode of the at least one second ESD protection element and/or to the first doped region of the (k+1)-th diode of the at least one second ESD protection element.

In accordance with another exemplary embodiment of the invention, the ESD protection device is formed using a silicon on insulator technology (SOI technology). In other words, in accordance with this exemplary embodiment, the at least one first ESD protection element of the ESD protection device and the at least one second ESD protection element of the ESD protection device have a silicon on insulator structure (SOI structure).

In accordance with another exemplary embodiment of the invention, the ESD protection device is formed using a FinFET technology or a MuGFET technology. In other words, in accordance with this exemplary embodiment, the at least one first ESD protection element of the ESD protection device and the at least one second ESD protection element of the ESD protection device have a fin structure.

In accordance with another exemplary embodiment of the invention, when using a FinFET or MuGFET technology, in which technology no planar devices are available, a diode stack or a diode chain can be segmented into a plurality of parallel diode paths, each diode path being realized by means of an ESD protection element having a fin structure.

In accordance with another exemplary embodiment of the invention, in an ESD protection device having a plurality of parallel-connected ESD protection elements or diode stacks with gated diodes, at least one first ESD protection element may be formed as at least one discharge path of the ESD protection device, and at least one second ESD protection element may be formed as a bias path of the ESD protection device, said bias path being connected in parallel with the at least one discharge path. The gate bias potentials required for the driving of the gate regions of the ESD protection elements can clearly be generated or provided with the aid of the bias path connected in parallel. The at least one second ESD protection element may be formed as a small individual bias diode chain which is arranged electrically in parallel with the main diode chain elements (i.e. the at least one first ESD protection element or discharge path) of the ESD protection device.

In accordance with another exemplary embodiment of the invention, the at least one second ESD protection element (more precisely the fin structure or SOI structure of the at least one second ESD protection element) has a smaller width than the at least one first ESD protection element (more precisely the fin structure or SOI structure of the at least one first ESD protection element).

In other words, in accordance with one exemplary embodiment of the invention, the at least one bias path may be narrower than the at least one discharge path.

In accordance with another exemplary embodiment of the invention, the at least one first ESD protection element may have a width of approximately 5 nm to 100 μm.

In accordance with another exemplary embodiment of the invention, the at least one second ESD protection element may have a width of approximately 5 nm to 10 μm.

In accordance with another exemplary embodiment, for example approximately: $0.001 \leq \gamma \leq 0.1$ holds true for the ratio $\gamma = W_{bias}/W_{dis}$ between the width of the at least one bias path $W_{bias}$ and the width of the at least one discharge path $W_{dis}$.

In accordance with another exemplary embodiment of the invention, the ESD protection device has a plurality of first ESD protection elements having at least one common gate region.

In accordance with another exemplary embodiment of the invention, the ESD protection device has n common gate regions, wherein for all k ($k \in N$, $1 \leq k \leq n$) it holds true that the k-th common gate region is formed on or above the k-th intrinsic regions of the plurality of first ESD protection elements.

In other words, in accordance with this exemplary embodiment, the k-th common gate region is formed jointly on or above all k-th intrinsic regions.

In accordance with another exemplary embodiment of the invention, for all k ($k \in N$, $1 \leq k \leq n$) it holds true that the k-th common gate region is additionally formed on or above the k-th intrinsic region of the at least one second ESD protection element of the ESD protection device.

In a method for producing an ESD protection element in accordance with another exemplary embodiment of the invention, the ESD protection element may be formed such that it has a silicon on insulator structure.

Clearly, in accordance with this exemplary embodiment, the ESD protection element may be produced in an SOI technology or using an SOI technology (for example an FDSOI technology (FDSOI: Fully Depleted Silicon on Insulator=silicon on insulator structure fully depleted of charge carriers)).

In accordance with an alternative exemplary embodiment of the invention, the ESD protection element may be formed such that it has a fin structure.

Illustratively, in accordance with this exemplary embodiment, the ESD protection element may be produced in a FinFET technology or a MuGFET technology.

In accordance with another exemplary embodiment of the invention, an ESD protection element is provided which is based on a diode stack having a plurality of diodes which are connected in series with one another, and which ESD protection element can be used in a MuGFET technology or in an SOI technology.

In accordance with one exemplary embodiment of the invention, a diode stack can be operated during an ESD discharge event in forward conduction or the forward direction (and not in the more critical breakdown mode), in order effectively to limit the ESD voltage and to conduct away the current. On account of thermodynamic conditions, the diodes of the stack intrinsically have, compared with other ESD protection elements, the highest possible ESD robustness—for a given technology.

In accordance with one exemplary embodiment of the invention, the ESD protection element may have one or a plurality of gate regions (gates). In accordance with an alternative exemplary embodiment of the invention, an ESD protection element may be realized without a gate region, for example in a process technology in which a silicide blocking is available. By means of the process option of silicide blocking, the formation of (ESD-sensitive) gate oxides can be avoided, and, in addition, a formation of gate connections is not necessary in this case.

In an ESD protection element in accordance with another exemplary embodiment of the invention, in contrast to conventional ESD solutions, no substrate contact or body contact is required.

In accordance with another exemplary embodiment of the invention, an ESD protection element is provided which is compatible with other elements or devices of a MuGFET process technology and/or an SOI process technology.

For example, in contrast to conventional solutions, no polysilicon is required as gate material. The diodes formed in the ESD protection element are fully compatible with metal gate processes.

In an ESD protection element set up as a diode stack in accordance with another exemplary embodiment of the invention, in comparison with devices based on bulk technologies, it is possible to increase the number of diodes in the stack without a more than proportionally increased leakage current occurring, since no parasitic Darlington transistor is formed in SOI.

An ESD protection element without a gate and with a silicide blocking in accordance with another exemplary embodiment of the invention makes it possible to manufacture one or a plurality of additional N+/P+ junctions, which may be advantageous owing to the very low breakdown voltage thereof and/or the resistance characteristic thereof. In accordance with one exemplary embodiment, said N+/P+ junctions can be automatically integrated into the diode stack.

FIG. 1A shows an ESD protection element 100 in accordance with a first exemplary embodiment of the invention. The ESD protection element 100 has a plurality, more precisely $n \in N$, of diodes $D_1, D_2, \ldots, D_n$ which are connected in series with one another and which are formed in a contiguous active area 102 ("Active area"). Four diodes are illustrated by way of example in the exemplary embodiment shown in FIG. 1A (i.e. n=4). Generally, any desired number n ($n \in N$, $n \geq 2$) of diodes $D_1, D_2, \ldots, D_n$ connected in series with one another may be formed in the active area 102, where the number of diodes can be adapted to the respective operating conditions (e.g. operating voltages) under which the ESD protection element 100 or an electrical circuit in which the ESD protection element 100 is used is operated.

Clearly, the ESD protection element 100 is formed as a diode stack (also called diode chain) composed of n diodes $D_1, D_2, \ldots, D_n$ connected in series, wherein the diodes $D_1, D_2, \ldots, D_n$ of the diode stack 100 are formed in a common active area 102 or jointly utilize a single active area 102.

The ESD protection element 100 has a silicon on insulator structure 103 comprising a buried oxide layer 104 (BOX: Buried Oxide) and a silicon layer (not shown in the initial state) formed on the buried oxide layer 104. The active area 102 is formed in the silicon layer on the buried oxide layer 104 and is electrically insulated laterally by means of electrically insulating regions 105 formed as shallow trench isolation regions (STI: Shallow Trench Isolation).

The ESD protection element 100 has a plurality of first doped regions 106, which are heavily p-doped (P+). Furthermore, the ESD protection element 100 has a plurality of second doped regions 107, which are heavily n-doped (N+). Each of the diodes $D_1$ to $D_n$ of the ESD protection element 100 which are formed in the active area 102 has in each case a first doped region 106 and a second doped region 107, an intrinsic region 108 in each case being formed between the first doped region 106 and the second doped region 107 of each diode. As an alternative, the regions 108 may be formed as weakly doped regions, for example as weakly p-doped or as weakly n-doped regions, for example having a dopant concentration of approximately less than $10^{18}$ cm$^{-3}$.

The diodes $D_1$ to $D_n$ adjoin one another in such a way that for all k ($k \in N$, $1 \leq k \leq n-1$) it holds true that the second doped region 107 of the k-th diode $D_k$ and the first doped region 106 of the (k+1)-th diode $D_{k+1}$ have a common interface 167. By way of example, the second doped region 107 of the first diode $D_1$ and the first doped region 106 of the second diode $D_2$ have a common interface 167. Clearly, a pn junction 167 is formed between each two adjacent diodes $D_k$ and $D_{k+1}$.

The ESD protection element 100 furthermore has n gate regions $G_1, G_2, \ldots, G_n$, a gate region in each case being formed on or above each of the intrinsic regions 108. In other words, for all k ($k \in N$, $1 \leq k \leq n$) it holds true that the k-th gate region $G_k$ is formed on or above the k-th intrinsic region 108, i.e. the intrinsic region 108 of the k-th diode $D_k$. Each gate region has in each case an electrically insulating layer 109' (gate dielectric), which is formed on the respective intrinsic region 108, and also an electrically conductive gate layer 109" formed on the electrically insulating layer 109'. The electrically insulating layer 109' may be formed as an oxide layer or gate oxide. The electrically conductive gate layer 109" is formed as a metal layer. Clearly, the diodes $D_1, D_2, \ldots, D_n$ of the ESD protection element 100 are formed as gated diodes, the gates being formed as metal gates. As an alternative, the gates may be formed as polysilicon gates, cf. FIG. 1B.

The highly doped regions 106 and 107 are silicided, i.e. a silicide layer 110 is formed on or in an upper partial region of each first doped region 106 and on or in an upper partial region of each second doped region 107.

Illustratively, the highly doped regions 106, 107 of the diodes $D_1, D_2, \ldots, D_n$ are covered with the silicide layer 110. In particular, for all k ($k \in N$, $1 \leq k \leq n-1$) it holds true that the second doped region 107 of the k-th diode $D_k$ and the first doped region 106 of the (k+1)-th diode $D_{k+1}$ have a common silicide layer 110, by means of which clearly the pn junction at the interface 167 between the adjacent diodes $D_k$ and $D_{k+1}$ is electrically bridged. In other words, the individual diodes of the diode stack 100 are electrically connected to one another by means of the silicide layer 110.

It should be noted in this context that during the manufacturing of the ESD protection element 100, the first doped regions 106 and/or the second doped regions 107 may be silicided such that an electrical contact of the silicide layer 110 with one or a plurality of intrinsic regions 108 is avoided (for example by means of the formation of gate spacers), also cf. the description of the exemplary embodiment shown in FIG. 4.

An electrical contact 111 is in each case formed on the first doped region 106 of the first diode $D_1$ or on the silicide layer 110 formed on the first doped region 106, and also on the second doped region 107 of the n-th diode $D_n$ or on the silicide layer 110 formed on the second doped region 107, and a metal layer 111a is in each case formed on the electrical contact 111. By means of the electrical contact 111 and the metal layer 111a, the first doped region 106 of the first diode $D_1$ and the second doped region 107 of the n-th diode $D_n$ can be electrically contact-connected, for example to a high electrical potential and respectively to a low electrical potential of the circuit. The first doped region 106 of the first diode $D_1$ illustratively forms an anode (denoted by "Anode" in FIG. 1A) of the ESD protection element 100, and the second doped region 107 of the n-th diode $D_n$ illustratively forms a cathode (denoted by "Cathode" in FIG. 1A) of the ESD protection element 100.

Generally, the first doped region 106 and the second doped region 107 of the k-th diode $D_k$ ($1 \leq k \leq n$) form an anode region and a cathode region, respectively, of the diode $D_k$, where for $1 \leq k \leq n-1$ it holds true that the cathode (N+ region 107) of the k-th diode $D_k$ and the anode (P+ region 106) of the (k+1)-th diode $D_{k+1}$ form a pn junction, and wherein furthermore the anode of the first diode $D_1$ and the cathode of the n-th diode $D_n$ illustratively serve as connection regions of the ESD protection element 100.

Furthermore, for all k ($1 \leq k \leq n$) it holds true that the k-th gate region $G_k$ is electrically coupled to the first doped region 106 (i.e. the anode) of the k-th diode $D_k$ and/or to the second doped region 107 (i.e. the cathode) of the (k−1)-th diode $D_{k-1}$. For this purpose, electrical contacts 111 are formed on the corresponding first doped regions 106 (P+ regions 106) and second doped regions 107 (N+ regions 107) or on the silicide layer 110 formed thereon, which electrical contacts 111 are electrically coupled to the corresponding gate region $G_k$ (schematically illustrated by the electrical coupling lines 112 in FIG. 1A). By way of example, the second gate region $G_2$ is electrically coupled to the first doped region 106, i.e. the P+ anode region 106 of the second diode $D_2$, and to the second doped region 107, i.e. the N+ cathode region 107 of the first diode $D_1$.

Clearly, what is achieved by means of the electrical couplings 112 in the case of the exemplary embodiment of the ESD protection element 100 as shown in FIG. 1A is that a gate bias potential of the k-th gate region $G_k$ can be tapped off directly from the corresponding anode connection (i.e. the P+ implantation) of the k-th diode $D_k$.

Under this bias condition, an n-conducting channel can be formed in the intrinsic region 108 formed between the first doped region 106 and the second doped region 107 of the diode $D_k$, to put it another way in the body region of the diode $D_k$. A MOS current thereby generated in the body region 108 can be superposed on the forward diode current, with the result that an improved current conduction behavior can be achieved in the case of an ESD event.

When a midgap gate material is used, the gate region $G_k$ of a diode $D_k$ may alternatively also be electrically coupled to the corresponding cathode of the diode $D_k$, with the result that a p-channel can be formed in the body region, cf. the exemplary embodiment described below in connection with FIG. 1B.

FIG. 1B shows an ESD protection element 150 in accordance with another exemplary embodiment of the invention. The ESD protection element 150 differs from the ESD protection element 100 shown in FIG. 1A by virtue of the fact that the electrically conductive gate layer 109" of each gate region $G_k$ ($1 \leq k \leq n$) is formed as a polysilicon layer. Furthermore, in the case of the ESD protection element 150 shown in FIG. 1B, both the highly doped regions 106, 107 and the gate regions $G_1, G_2, \ldots, G_n$ are silicided, that is to say that the silicide layer 110 is additionally formed on or in an upper partial region of each gate region $G_1, G_2, \ldots, G_n$. Illustratively, both the gates $G_1, G_2, \ldots, G_n$ and the highly doped regions 106, 107 of the diodes $D_1, D_2 \ldots, D_n$ are covered with the silicide layer 110. Furthermore, in the case of the ESD protection element 150, the gate regions $G_1, G_2, \ldots, G_n$ are in each case electrically coupled to the second doped region 107 (N+ cathode region 107) of the corresponding diode $D_1$, $D_2, \ldots, D_n$ and/or to the adjoining first doped region 106 (P+ anode region 106), of the adjacent diode. In other words, in this case for all k ($1 \leq k \leq n$) it holds true that the k-th gate region $G_k$ is electrically coupled to the second doped region 107 (i.e. the cathode) of the k-th diode $D_k$ and/or to the first doped region 106 (i.e. the anode) of the (k+1)-th diode $D_{k+1}$. Illustratively, the bias potential of the k-th gate region $G_k$ can therefore be tapped off from the corresponding cathode terminal (i.e. the N+ implantation) of the k-th diode $D_k$. Under this bias condition, a p-conducting channel can be formed in the respective intrinsic region 108 (body region) of the diode $D_k$. Analogously to the ESD protection element 100 described in connection with FIG. 1A, in the case of the ESD protection element 150, too, a MOS current can be superposed on the forward diode current during an ESD event, with the result that it is once again possible to achieve an improved current conduction behavior.

In accordance with alternative configurations of the invention, both in the case of the ESD protection element 100 shown in FIG. 1A and in the case of the ESD protection element 150 shown in FIG. 1B, in each case one or a plurality of dummy contact structures or dummy contacts may optionally be formed on one or a plurality of the partial regions of the silicide layer 110 that are formed between the gate regions, which dummy contacts serve as an additional heat sink (not shown directly in FIG. 1A or FIG. 1B, cf. FIG. 4 and associated description). The dummy contacts may be formed on a silicide partial region 110 for example such that they lie in a line with a corresponding contact 111—shown in FIG. 1A and FIG. 1B—for the gate bias tapping, that is to say clearly on a straight line running perpendicular to the plane of the drawing of FIG. 1A and FIG. 1B through the corresponding contact 111.

FIG. 2 shows an ESD protection element 200 in accordance with another exemplary embodiment of the invention. The ESD protection element 200 differs from the ESD protection elements 100 and 150 shown in FIG. 1A and FIG. 1B, respectively, inter alia by virtue of the fact that a siliciding of the gate regions (gates) $G_1, G_2, \ldots, G_n$ and of the connections between the individual diodes is prevented or blocked in the case of the ESD protection element 200. The siliciding may be blocked with the aid of a mask. The contour of the silicide-blocked region is schematically illustrated by means of the contour line 201 in FIG. 2. A pn junction 167 is in each case formed between the highly doped N+ regions 107 and P+ regions 106 of two adjacent diodes. In other words, for each two adjacent diodes $D_k$, $D_{k+1}$, a pn junction 167 is formed between the second doped region 107 (N+) of the k-th diode $D_k$ and the first doped region 106 (P+) of the (k+1)-th diode $D_{k+1}$.

By means of the pn junctions 167, a DC leakage current of the ESD protection element can be reduced, and, during an ESD discharge event in which a high ESD current flows, an additional voltage drop can take place at the pn junctions 167 (operated in the reverse direction).

Clearly, the diodes $D_1, D_2, \ldots, D_n$ of the ESD protection element 200 (as in the case of the ESD protection elements 100 and 150) are formed as gated diodes, but are not electrically connected to one another by means of the silicide layer 110. The pn junctions 167 between the individual diodes are therefore not electrically bridged, in contrast to the exemplary embodiments shown in FIG. 1A and FIG. 1B.

In accordance with the exemplary embodiment shown in FIG. 2, the gate regions $G_1, G_2, \ldots, G_n$ of the ESD protection element 200 are formed as electrically floating gates. In alternative configurations of the invention, the gate regions $G_1$, $G_2, \ldots, G_n$ of the ESD protection element 200 can be electrically coupled to a bias potential, for example in an analogous manner to that described in connection with FIG. 1A and FIG. 1B.

FIG. 3 shows an ESD protection element 300 in accordance with another exemplary embodiment of the invention. The ESD protection element 300 illustratively differs from the ESD protection element 200 shown in FIG. 2 by virtue of the fact that the diodes $D_1, D_2, \ldots, D_n$ of the ESD protection element 300 are formed as non-gated diodes, i.e. as diodes without a gate region or gate. The diodes can be realized by means of silicide blocking. The entire diode stack 300 (with the exception of the silicide regions 110 below the electrical contacts 111) is silicide-blocked, the silicide-blocked region once again being illustrated schematically by means of the contour line 201. As in the case of the ESD protection element 200 shown in FIG. 2, pn junctions (N+/P+ junctions) 167 are formed between the individual diodes. The first doped regions 106 (P+ regions 106) and/or the second doped regions 107 (N+ regions 107) may be so heavily doped that the pn junctions 167 illustratively and approximately act as ohmic junctions, existing potential barriers being advantageous (see the next paragraph). The dopant concentration in the first doped regions 106 and/or the second doped regions 107 may be for example greater than $10^{20}$ cm$^{-3}$.

One effect of the exemplary embodiment shown in FIG. 3 can be seen in the fact that a smaller number n of diodes $D_1$, $D_2, \ldots, D_n$ are required for a predetermined operating voltage. By means of the additional pn junctions 167, it is possible for example to influence the leakage current of the ESD protection element 300 and the on voltage during an ESD event.

FIG. 4 shows an ESD protection element 400 in accordance with another exemplary embodiment of the invention. The diodes $D_1, D_2, \ldots, D_n$ of the ESD protection element 400 are formed as non-gated diodes as in the case of the ESD protection element 300 shown in FIG. 3, and in contrast thereto the N+/P+ junctions 167 of the ESD protection element 400 shown here are short-circuited by means of silicide regions 110. The formation of the silicide layer 110 or the silicide regions 110 on the first doped regions 106 and the second doped regions 107 (or in upper partial regions of the highly doped regions 106, 107) may be effected using a suitable mask in such a way that the intrinsic regions 108 are excluded from the siliciding. The contours of the silicide-blocked regions are schematically illustrated by means of the contour lines 401 in FIG. 4. As illustrated in FIG. 4, the silicide regions 110 are formed such that an electrical contact between the silicide layer 110 and an intrinsic region 108 is avoided.

In the case of the ESD protection element 400 shown in FIG. 4, it can happen on account of the bridging (in other words short-circuiting) of the pn junctions 167 by means of the silicide regions 110 during an ESD event that a not insignificant portion of the ESD discharge current flows through the shallow silicide regions 110. The construction of the high ESD current to the narrow silicide regions 110 can lead to a heating of the silicide regions 110 and hence of the ESD protection element 400.

In order that the heat which arises can be dissipated more effectively, in each case one or a plurality of dummy contact structures or dummy contacts 411 may optionally be formed on or above one or a plurality of the silicided pn junctions 167, in other words on one or a plurality of the silicide strips 110 which electrically connect adjacent diodes to one another. The dummy contact structures 411 may typically be arranged in one or a plurality of series on the silicide regions 110. In this context, a dummy contact 411 is to be understood to be a contact which has a similar structure to the electrical contacts 111, but in contrast thereto is not used for electrical contact connection. In addition, a metal layer 411a or a metal strip 411a may optionally be formed on a dummy contact 411.

By means of the formation of one or a plurality of dummy contacts 411 (and optionally dummy metal strips 411a), it is possible to achieve an improved device cooling, in other words an improved cooling of the ESD protection element 400, since the heat which arises during an ESD event in the shallow silicide regions 110 can be dissipated better by means of the contacts 411 (and if appropriate the metal strips 411a formed on the contacts). The contacts 411 and the metal strips 411a clearly serve as an additional heat sink of the ESD protection element 400.

It should be noted in this context that the formation of dummy contacts 411 or dummy metal strips 411a does not lead to an increased area requirement of the device layout.

In accordance with an alternative configuration (not shown) of the invention, the dummy contacts 411 may also be formed directly on one or a plurality of the first doped regions 106 and/or second doped regions 107, i.e. on one or a plurality of non-silicided regions 106, 107.

The ESD protection elements shown in FIG. 1A to FIG. 4A have an SOI structure, by way of example. As an alternative, the ESD protection elements described above may also have a fin structure or be realized in a FinFET or MuGFET technology.

Figure 5A:
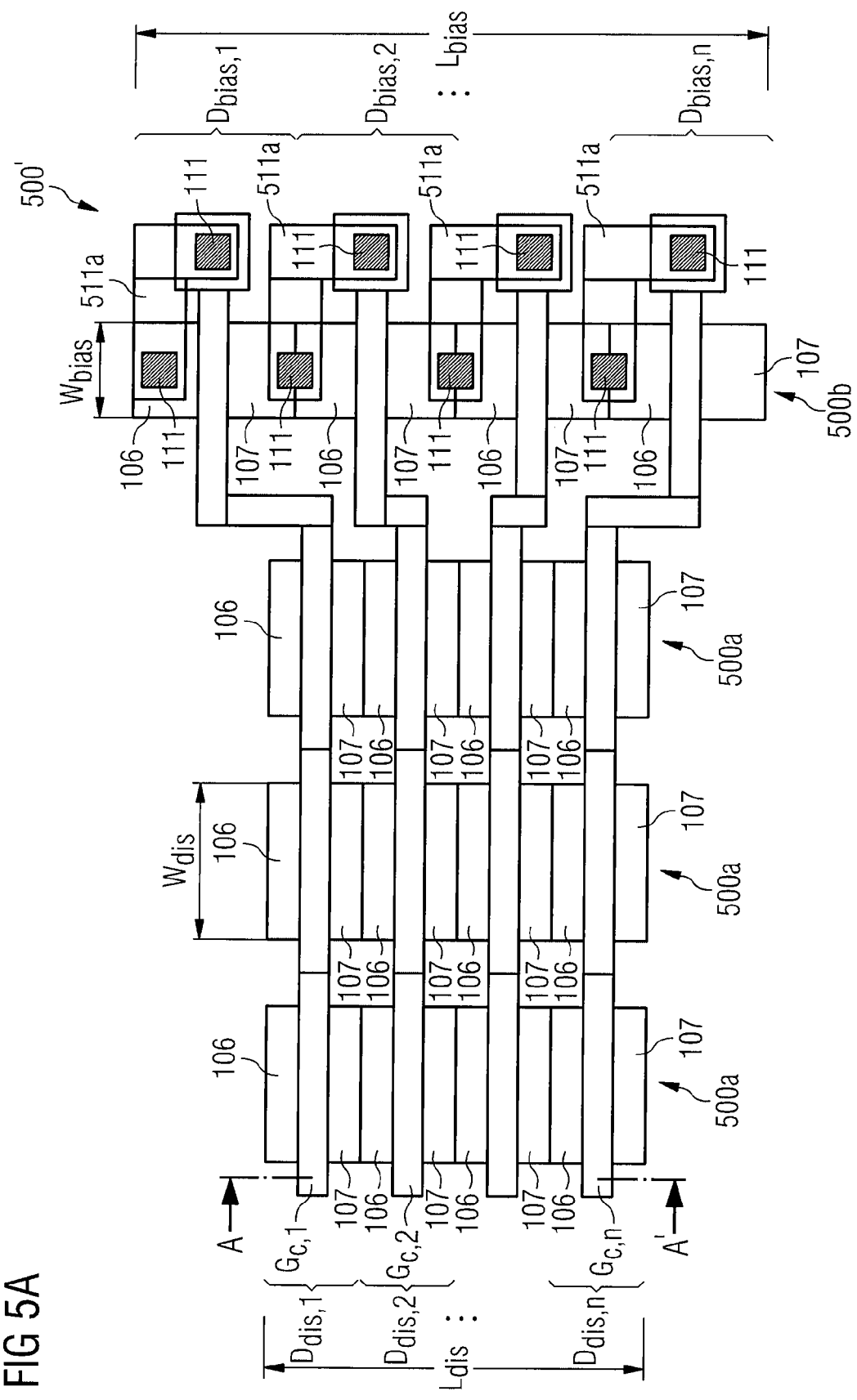
FIG. 5A shows a layout illustration of an ESD protection device in accordance with one exemplary embodiment of the invention.

FIG. 5A shows a layout illustration of an ESD protection device 500' in accordance with one exemplary embodiment of the invention, which ESD protection device 500' serves for use as ESD protection in an electrical circuit, and FIG. 5B shows an electrical schematic circuit diagram 550 corresponding to the layout illustration.

The ESD protection device 500' has a plurality (in the exemplary embodiment shown three, generally m∈N) of first ESD protection elements 500a, and also a second ESD protection element 500b. The first ESD protection elements 500a are connected in parallel with one another and are furthermore connected in parallel with the second ESD protection element 500b, cf. the corresponding electrical schematic circuit diagram 550 shown in FIG. 5b. The first ESD protection elements 500a and the second ESD protection element 500b are furthermore connected in parallel with at least one element of the electrical circuit that is to be protected against an ESD event (not shown). The first ESD protection elements 500a have in each case n (n∈N, n≧2) diodes $D_{dis,1}$, $D_{dis,2}, \ldots, D_{dis,n}$ connected in series with one another, and the second ESD protection element 500b has n diodes $D_{bias,1}$, $D_{bias,2}, \ldots, D_{bias,n}$ connected in series with one another.

Clearly, the ESD protection device 500' has a plurality (in the example shown three) of parallel discharge paths 500a, a first ESD protection element 500a in each case acting as a discharge path 500a. The first ESD protection elements 500a have in cross section (along the cross-sectional line A-A' depicted in FIG. 5A) a structure similar to the ESD protection element 100 shown in FIG. 1A, but the contacts 111 for the gate potential tapping are obviated in accordance with the exemplary embodiment shown in FIG. 5A.

In other words, the diodes $D_{dis,1}, \ldots, D_{dis,n}$ formed in a first ESD protection element 500a or discharge path are formed as gated diodes, wherein for all k (k∈N, 1≦k≦n) it holds true that in each case a common gate region $G_{c,k}$ is formed jointly on or above the k-th intrinsic regions (in the layout illustration shown in FIG. 5A, the intrinsic regions are concealed by the gate regions, cf. FIG. 1A) of all the first ESD protection elements 500a. By way of example, a first common gate region $G_{c,1}$ is formed jointly on all the first intrinsic regions, i.e. on the intrinsic regions formed in the respective first diodes $D_{dis,1}$.

For all k (k∈N, 1≦k≦n) it furthermore holds true that the k-th common gate region $G_{c,k}$ is formed on or above the k-th intrinsic region of the second ESD protection element 500b and is electrically coupled by means of electrical contacts 111 and electrical connecting lines 511a (for example metallic connections) to the first doped region 106 of the k-th diode $D_{bias,k}$ of the second ESD protection element 500b and/or to the second doped region 107 of the (k−1)-th diode $D_{bias,k-1}$ of the second ESD protection element 500b.

The second ESD protection element 500b illustratively serves as a bias path of the ESD protection device 500', in the sense that the gate potentials or bias potentials required for a driving of the common gate regions $G_{c,1}, G_{c,2}, \ldots, G_{c,n}$ can be provided by means of the second ESD protection element 500b. The gate potentials are clearly tapped off at the anode regions 106 of the second ESD protection element 500b and jointly provided to the second ESD protection element 500b and to all the first ESD protection elements 500a by means of the common gate regions $G_{c,1}, G_{c,2}, \ldots, G_{c,n}$.

In an alternative configuration of the invention, the gate potentials can be tapped off at the cathode regions 107 of the second ESD protection element 500b (cf. FIG. 1B). In this case, for all k (k∈N, 1≦k≦n) it correspondingly holds true that the k-th common gate region $G_{c,k}$ is electrically coupled to the second doped region 107 of the k-th diode $D_{bias,k}$ of the second ESD protection element 500b and/or to the first doped region 106 of the (k+1)-th diode $D_{bias,k+1}$ of the second ESD protection element 500b.

The ESD protection device 500' may be formed in an SOI technology, alternately in a FinFET technology or MuGFET technology. In other words, the first ESD protection elements 500a and the second ESD protection element 500b of the ESD protection device 500' may have an SOI structure or alternatively a fin structure (fin).

In the case of an ESD protection device 500' formed in a FinFET technology or MuGFET technology, the width $W_{dis}$ of the discharge paths 500a (i.e. of the first ESD protection elements 500a formed as fins) may have a value which is typical of the FinFET or MuGFET technology used; by way of example, the width $W_{dis}$ may be approximately 5 nm to 200 nm.

When an SOI technology is used, the width $W_{dis}$ of the first ESD protection elements 500a may be significantly greater than in a FinFET/MuGFET technology. By way of example, when an SOI technology is used, the width $W_{dis}$ may be approximately 200 nm to 100 μm.

In accordance with one exemplary embodiment of the invention, the network (clearly the contacts 111 and connections 511a shown in FIG. 5A) with the aid of which the gate potentials are provided for the gate regions $G_{c,1}, G_{c,2}, \ldots, G_{c,n}$ formed on or above the intrinsic regions is only required once since the bias potentials for the corresponding gates of the ESD protection elements 500a connected in parallel can be provided in an area-efficient manner by means of a single narrow bias path (i.e. the second ESD protection element 500b).

Consequently, a layout that is very efficient in respect of area is provided since a pick-up of the gate bias potentials (to put it another way a gate bias pick-up) is effected only at a single ESD protection element (i.e. the second ESD protection element or bias path 500b), and the gate potentials picked up at the bias path 500b are jointly provided to the second ESD protection element 500b and also to all the first ESD protection elements 500a. The second ESD protection element 500b or the bias path 500b may additionally be formed, as shown, in an edge region of the ESD protection device 500'.

The second ESD protection element (bias path) 500b may have a width $W_{bias}$ that is less than the width $W_{dis}$ of the first ESD protection elements (discharge paths) 500a.

The ratio $W_{bias}/W_{dis}$ of the width $W_{bias}$ of the bias path 500b to the width $W_{dis}$ of the discharge paths may be approximately 0.001 to 0.1.

Furthermore, the discharge paths 500a may have a length $L_{dis}$ that is less than the length $L_{bias}$ of the bias path 500b. $L_{dis}$ may be for example up to 50% less than $L_{bias}$, which leads to a significant space saving in the layout.

In accordance with an alternative configuration (not shown) of the invention, the ESD protection device 500' has a second bias path 500b, which is connected in parallel with the discharge paths 500a and which is clearly formed in such a way that the ESD protection device 500' has a symmetrical layout.

The ESD protection elements 500a and 500b connected in parallel are connected in parallel with at least one element of the electrical circuit that is to be protected against an ESD pulse, where the first doped regions 106 of the first diodes $D_{dis,1}$ and $D_{bias,1}$ (illustratively the anodes of the ESD protection elements 500a and 500b, respectively) may be electrically coupled to a high electrical potential (for example a voltage-carrying node of the electrical circuit) (illustrated by the electrical node 551 in FIG. 5B), and where the second doped regions 107 of the n-th diodes $D_{dis,n}$ and $D_{bias,n}$ (illustratively the cathodes of the ESD protection elements 500a and 500b, respectively) may be electrically coupled to a low electrical potential (for example to the ground potential) (illustrated by the ground symbol 552 in FIG. 5B).

In accordance with another exemplary embodiment of the invention, an ESD protection element is provided which has at least two diodes connected in series with one another, wherein the at least two diodes are formed in at least two active areas that are insulated from one another, and wherein the ESD protection element has a silicon on insulator structure or a fin structure.

Figure 6:
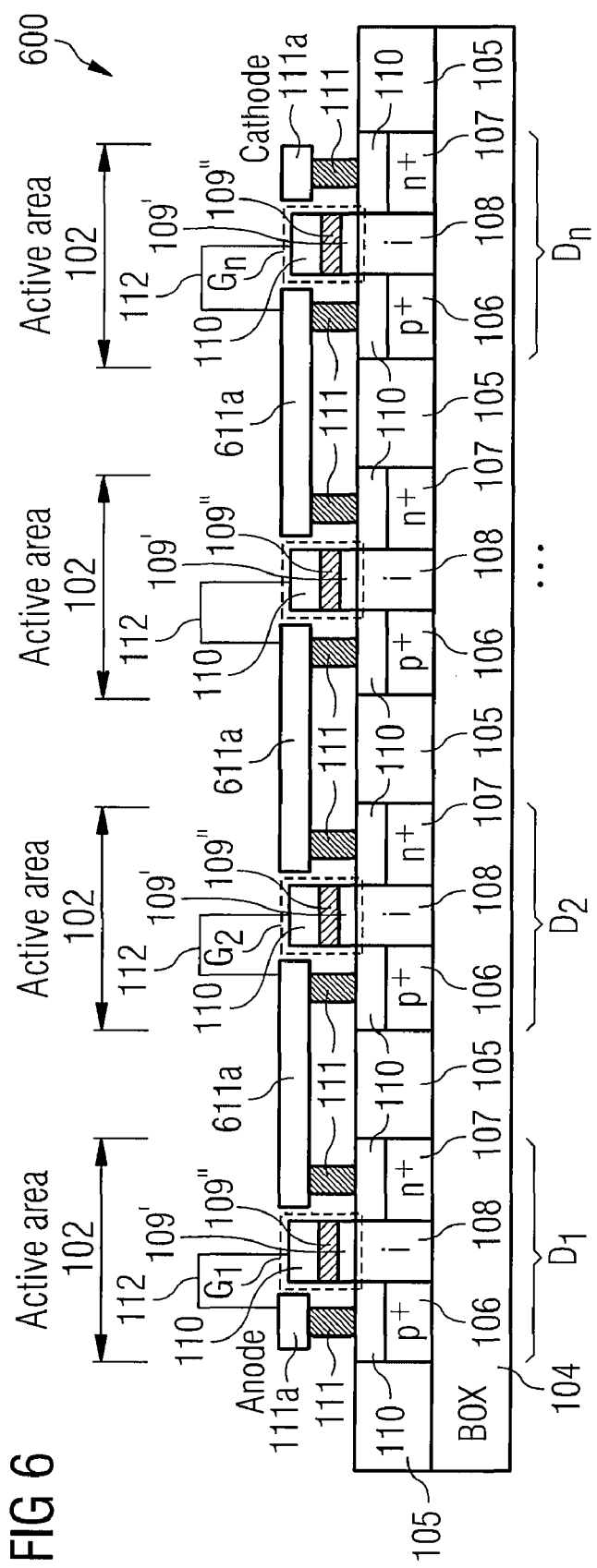
FIG. 6 shows an ESD protection element in accordance with another exemplary embodiment of the invention.

FIG. 6 show such an ESD protection element 600 by way of example. In an SOI structure (alternatively in a fin structure), n ($n \in N, n \geq 2$) active areas 102 ("Active area") that are electrically insulated from one another are formed. The diodes $D_1, D_2, \ldots, D_n$ of the ESD protection element 600 that are connected in series with one another are connected in series with one another by means of electrical connections 611a (for example metallic connecting lines). The ESD protection element 600 may be produced in an SOI technology, alternatively in a FinFET technology or MuGFET technology. The diodes $D_1, D_2, \ldots, D_n$ are formed as gated diodes, wherein the gate regions $G_1, G_2, \ldots, G_n$ of the diodes $D_2, \ldots, D_n$ are in each case electrically coupled to one of the corresponding connection regions of the diode (anode region 106 or cathode region 107) (to the p+-doped anode region 106 of the corresponding diode in the case of the ESD protection element 600 shown in FIG. 6). The ESD protection element 600 is illustratively formed as a diode stack in an SOI or MuGFET technology.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are intended to be embraced.

What is claimed is:

1. An ESD protection element for use in an electrical circuit, comprising:
   a plurality of diodes which are connected in series with one another and which are formed in a contiguous active area,
   wherein the ESD protection element has a fin structure.

2. The ESD protection element as claimed in claim 1, wherein the active area has silicon.

3. The ESD protection element as claimed in claim 1, wherein the active area is formed on a buried oxide layer.

4. The ESD protection element as claimed in claim 1, further comprising:
   a plurality of first doped regions having a first conductivity type; and
   a plurality of second doped regions having a second conductivity type, which is opposite to the first conductivity type,
   wherein each diode has a first doped region and a second doped region adjacent to the first doped region.

5. The ESD protection element as claimed in claim 4, wherein at least one diode has at least one intrinsic or weakly doped region which is formed between the first doped region and the second doped region of the at least one diode.

6. The ESD protection element as claimed in claim 4, further comprising n($n \in N, n \geq 2$) diodes connected in series with one another, wherein for all k ($k \in N, 1 \leq k \leq n-1$) it holds true that the second doped region of the k-th diode and the first doped region of the (k+1)-th diode have a common interface.

7. The ESD protection element as claimed in claim 6, further comprising n intrinsic or weakly doped regions, wherein the k-th ($k \in N, 1 \leq k \leq n$) intrinsic or weakly doped region is formed between the first doped region and the second doped region of the k-th diode.

8. The ESD protection element as claimed in claim 5, further comprising at least one gate region which is formed on or above the at least one intrinsic or weakly doped region.

9. The ESD protection element as claimed in claim 8, wherein the at least one gate region has an electrically insulating layer and an electrically conductive gate layer formed on the electrically insulating layer.

10. The ESD protection element as claimed in claim 7, further comprising n gate regions, where for all k ($k \in N, 1 \leq k \leq n$) it holds true that the k-th gate region is formed on or above the k-th intrinsic or weakly doped region.

11. The ESD protection element as claimed in claim 10, wherein for all k ($k \in N, 1 \leq k \leq n$) it holds true that the k-th gate region is electrically coupled to the first doped region of the k-th diode or to the second doped region of the (k−1)-th diode.

12. The ESD protection element as claimed in claim 10, wherein for all k (k∈N, 1≦k≦n) it holds true that the k-th gate region is electrically coupled to the first doped region of the k-th diode and to the second doped region of the (k−1)-th diode.

13. The ESD protection element as claimed in claim 10, wherein for all k (k∈N, 1≦k≦n) it holds true that the k-th gate region is electrically coupled to the second doped region of the k-th diode or to the first doped region of the (k+1)-th diode or to both.

14. The ESD protection element as claimed in claim 4, wherein at least one of the first doped regions and the second doped regions is silicided.

15. The ESD protection element as claimed in claim 6, wherein for all k (k∈N, 1≦k≦n−1) it holds true that the second doped region of the k-th diode and the first doped region of the (k+1)-th diode have a common silicide layer.

16. The ESD protection element as claimed in claim 6, wherein for at least one k (k∈N, 1≦k≦n−1) it holds true that at least one dummy contact structure is formed on or above the second doped region of the k-th diode or on or above the first doped region of the (k+1)-th diode.

17. The ESD protection element as claimed in claim 6, wherein for at least one k (k∈N, 1≦k≦n−1) it holds true that at least one dummy contact structure is formed on or above the second doped region of the k-th diode and on or above the first doped region of the (k+1)-th diode.

18. The ESD protection element as claimed in claim 16, wherein the at least one dummy contact structure has a high thermal conductivity or a high specific heat capacity or both.

19. The ESD protection element as claimed in claim 16, wherein at least one layer is formed on the at least one dummy contact structure, which at least one layer has a high thermal conductivity or a high specific heat capacity or both.

20. The ESD protection element as claimed in claim 6, wherein the first doped region of the first diode is electrically coupled to a high electrical potential, or wherein the second doped region of the n-th diode is electrically coupled to a low electrical potential.

21. The ESD protection element as claimed in claim 6, wherein the first doped region of the first diode is electrically coupled to a high electrical potential, and wherein the second doped region of the n-th diode is electrically coupled to a low electrical potential.

22. The ESD protection element as claimed in claim 20, wherein the first doped region of the first diode is electrically coupled to an electrical supply voltage or to a voltage-carrying node of the electrical circuit.

23. The ESD protection element as claimed in claim 20, wherein the second doped region of the n-th diode is electrically coupled to an electrical supply voltage or to a voltage-carrying node of the electrical circuit.

24. The ESD protection element as claimed in claim 4, wherein the plurality of first doped regions is p-doped, and wherein the plurality of second doped regions is n-doped.

25. The ESD protection element as claimed in claim 4, wherein at least one of the first doped regions and second doped regions has a dopant concentration of approximately greater than $10^{20}$ cm$^{-3}$.

26. The ESD protection element as claimed in claim 11, wherein the electrically conductive gate layer has a metal material and/or a midgap material.

27. The ESD protection element as claimed in claim 1, set up as a diode stack.

28. An ESD protection element for use in an electrical circuit, comprising:
a plurality of diodes which are connected in series with one another and which are formed in a contiguous active area; and
at least one diode having a first doped region having a first conductivity type, a second doped region having a second conductivity type opposite to the first conductivity type, and an intrinsic or weakly doped region formed between the first and second doped region;
wherein the ESD protection element has a fin structure.

29. An ESD protection device for use in an electrical circuit, comprising:
at least one ESD protection element as claimed in claim 1, which is connected in parallel with at least one element of the electrical circuit that is to be protected against an ESD event.

30. An ESD protection device for use in an electrical circuit, comprising:
at least one ESD protection element as claimed in claim 28, which is connected in parallel with at least one element of the electrical circuit that is to be protected against an ESD event.

31. An ESD protection device for use in an electrical circuit, comprising:
at least one first ESD protection element and at least one second ESD protection element as claimed in claim 10, the at least one first ESD protection element and the at least one second ESD protection element being connected in parallel with at least one element of the electrical circuit that is to be protected against an ESD event,
wherein for all k (k∈N, 1≦k≦n) it holds true that the k-th gate region of the at least one first ESD protection element is electrically coupled to the first doped region of the k-th diode of the at least one second ESD protection element or to the second doped region of the (k−1)-th diode of the at least one second ESD protection element or to both.

32. An ESD protection device for use in an electrical circuit, comprising:
at least one first ESD protection element and at least one second ESD protection element as claimed in claim 10, the at least one first ESD protection element and the at least one second ESD protection element being connected in parallel with at least one element of the electrical circuit that is to be protected against an ESD event,
wherein for all k (k∈N, 1≦k≦n) it holds true that the k-th gate region of the at least one first ESD protection element is electrically coupled to the second doped region of the k-th diode of the at least one second ESD protection element or to the first doped region of the (k+1)-th diode of the at least one second ESD protection element or to both.

33. The ESD protection device as claimed in claim 31, wherein the fin structure of the at least one first ESD protection element has a width of approximately 5 nm to 200 nm.

34. The ESD protection device as claimed in claim 31, wherein the at least one second ESD protection element has a smaller width than the at least one first ESD protection element.

35. The ESD protection device as claimed in claim 34, wherein the ratio of the width of the at least one second ESD protection element to the width of the at least one first ESD protection element is approximately 0.001 to 0.1.

36. The ESD protection device as claimed in claim 32, wherein the at least one second ESD protection element has a smaller width than the at least one first ESD protection element.

37. The ESD protection device as claimed in claim 36, wherein the ratio of the width of the at least one second ESD protection element to the width of the at least one first ESD protection element is approximately 0.001 to 0.1.

38. The ESD protection device as claimed in claim 31, further comprising a plurality of first ESD protection elements which have at least one common gate region.

39. The ESD protection device as claimed in claim 38, further comprising n common gate regions, where for all k ($k \in N$, $1 \leq k \leq n$) it holds true that the k-th common gate region is formed on or above the k-th intrinsic regions of the plurality of first ESD protection elements.

40. The ESD protection device as claimed in claim 32, further comprising a plurality of first ESD protection elements which have at least one common gate region.

41. The ESD protection device as claimed in claim 40, further comprising n common gate regions, where for all k ($k \in N$, $1 \leq k \leq n$) it holds true that the k-th common gate region is formed on or above the k-th intrinsic regions of the plurality of first ESD protection elements.

42. A method for producing an ESD protection element, comprising:
    forming a plurality of diodes which are connected in series with one another in a contiguous active area,
    wherein the ESD protection element is formed such that it has a fin structure.

43. A method for producing an ESD protection element, comprising: forming a plurality of diodes which are connected in series with one another in a contiguous active area,
    wherein at least one diode has a first doped region having a first conductivity type, a second doped region having a second conductivity type opposite to the first conductivity type, and an intrinsic or weakly doped region formed between the first and second doped region;
    wherein the ESD protection element has a fin structure.

\* \* \* \* \*